United States Patent [19]
Frankeny et al.

[11] Patent Number: 5,161,087
[45] Date of Patent: Nov. 3, 1992

[54] PIVOTAL HEAT SINK ASSEMBLY

[75] Inventors: Jerome A. Frankeny, Taylor; Richard F. Frankeny, Austin; Karl Hermann, Austin; Rolf Wustrau, Austin, all of Tex.

[73] Assignee: International Business Machines Corporation, Armonk, N.Y.

[21] Appl. No.: 742,566

[22] Filed: Aug. 7, 1991

Related U.S. Application Data

[63] Continuation of Ser. No. 597,621, Oct. 15, 1990, abandoned.

[51] Int. Cl.⁵ .............................................. H05K 7/20
[52] U.S. Cl. .................................. 361/382; 165/80.3; 165/185; 174/16.3; 357/81; 357/82; 361/383; 361/386; 361/388
[58] Field of Search ............................ 165/80.3, 185; 174/16.3; 357/81, 82; 361/382-384, 386-389, 391

[56] References Cited

U.S. PATENT DOCUMENTS

| | | | |
|---|---|---|---|
| D. 307,540 | 5/1990 | McCarthy | D8/395 |
| 3,303,392 | 2/1967 | Zelina | 361/388 |
| 3,312,277 | 4/1967 | Chitouras et al. | 361/386 |
| 3,397,819 | 12/1976 | Eggert et al. | 361/386 |
| 4,314,311 | 2/1982 | Seytre et al. | 361/386 |
| 4,316,236 | 2/1982 | Lechner et al. | 361/386 |
| 4,415,025 | 11/1983 | Horvath | 361/386 |
| 4,525,769 | 6/1985 | Lehmann | 361/386 |
| 4,557,554 | 12/1985 | Blanc | 350/96.20 |
| 4,600,050 | 7/1986 | Noren | 361/384 |
| 4,612,601 | 9/1986 | Watari | 361/386 |
| 4,825,337 | 4/1989 | Karpmann | 361/386 |
| 4,914,551 | 4/1990 | Anschel et al. | 361/389 |
| 4,949,219 | 8/1990 | Moriizumi et al. | 361/386 |

FOREIGN PATENT DOCUMENTS

| | | | |
|---|---|---|---|
| 2608354 | 12/1986 | France. | |
| 946526 | 9/1962 | United Kingdom | 361/388 |
| 1597829 | 9/1981 | United Kingdom | 361/386 |

Primary Examiner—Gregory D. Thompson
Attorney, Agent, or Firm—Wayne P. Bailey

[57] ABSTRACT

This invention provides a heat sink assembly for cooling electrical and electronic circuits. A low cost assembly method is achieved by a pivotal assembly containing a heat sink which snaps into place adjacent to an electrical/electronic circuit which requires cooling. The snap-in heat sink assembly contains a resilient heat transfer material which is exposed to the devices requiring heat removal by windows or other openings in a plate which is disposed between the heat transfer material and the snap-in frame.

15 Claims, 2 Drawing Sheets

PIVOTAL HEAT SINK ASSEMBLY

This is a continuation of application Ser. No. 07/597,621, filed Oct. 15, 1990, now abandoned.

DESCRIPTION

1. Technical Field

The present invention relates to a heat sink apparatus for cooling electrical and electronic components.

2. Background of the Invention

Heat dissipation is an elementary requirement for most any electrical circuit, and when air alone will not suffice to dissipate the requisite amount of heat generated by these electrical devices, heat sinks are used to augment heat dissipation. Ways to dissipate heat via heat sink devices vary. and some of the more common devices use a series of fins connected to a rigid plate, the plate being placed in contact with the device to be cooled. The fins provide increased surface area for the surrounding air, and increase the rate of heat dissipation which would occur if the surface area of the heated device itself were used. The use of liquids to cool electrical devices is also known and operate on a principle similar to the way a radiator in an automobile is used to keep the engine relatively cool.

The types of heat sink devices in use today tend to be somewhat cumbersome to assemble and manufacture, however. Most systems employ heat sinks which are manufactured in such a way that the heat sink becomes integral with the electrical device being cooled, and are thus difficult to handle efficiently in a high-volume manufacturing environment.

Use of heat sinks with semiconductor devices mounted on a flexible substrate are known in the prior art. U.S. Pat. No. 4,914,551 discloses such a method, and shows how the heat sink becomes integral to the electrical device. In that patent, the heat sink is soldered to the electrical device carrier.

Other methods of improving the attachment of heat sinks to power devices, and not to semiconductor devices mounted on flexible materials, use clips as shown in U.S. Pat. No. D307540. In that patent, the power device is again physically attached to the heat sink, with a clip attaching a second surface area of the power device to a fin of the same heat sink.

The prior art has not addressed a heat sink device that can be readily attached to a preexisting electrical assembly having semiconductor devices attached to a flexible substrate.

It is therefore an object of the present invention to provide an improved heat sink device.

It is a further object of the present invention to provide an improved heat sink device for use with electrical devices attached to a flexible substrate.

It is yet another object of the present invention to provide an improved heat sink device designed for ease of manufacturing.

It is still another object of the present invention to provide an improved heat sink device which is easy to attach to an electronic carrier.

These and other advantages will be more fully described in the following description of the invention.

SUMMARY OF THE INVENTION

This invention provides a heat sink assembly for cooling electrical and electronic circuits. A low cost assembly method is achieved by a pivotal assembly containing a heat sink which snaps into place adjacent to an electrical/electronic circuit which requires cooling. The snap-in heat sink assembly contains a resilient heat transfer material which is exposed to the devices requiring heat removal by windows or other openings in a plate which is disposed between the heat transfer material and the snap-in frame. For attachment to the electrical device carrier the carrier has a base plate having a slot, and the snap-in heat sink assembly is inserted in the slot and pivoted into position, where a catch on the snap-in frame latches to the electrical device carrier.

DETAILED DESCRIPTION OF THE PREFERRED EMBODIMENT

Figure 1:
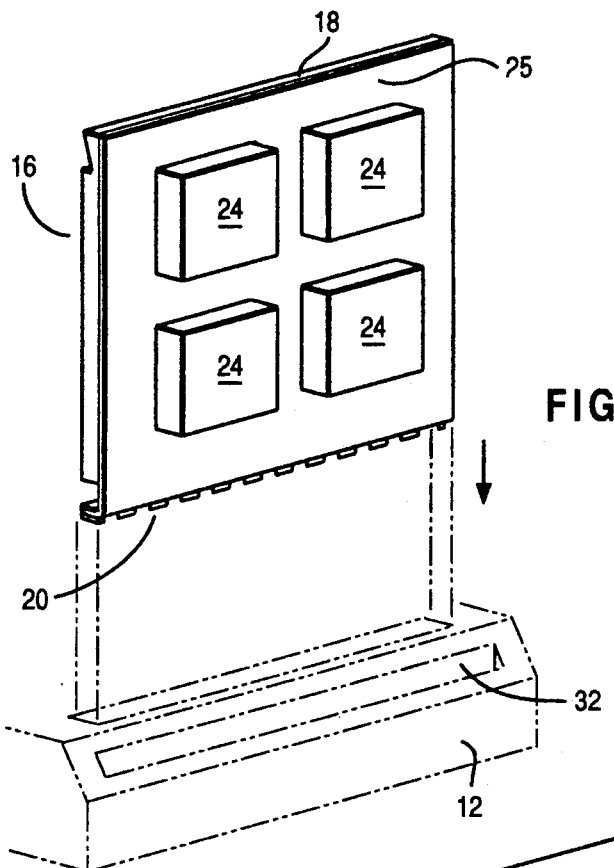
FIG. 1 is a perspective view of an unmounted carrier assembly.

FIG. 1 shows carrier/stiffener 18 which has a substrate 25 attached thereto and in the preferred embodiment this substrate is composed of a flexible Copper Invar Copper material. Invar being an alloy of nickel-iron. This substrate 25 has direct C-4 chips or other electrical components 24 attached thereto. forming a carrier assembly 16.

Figure 2:
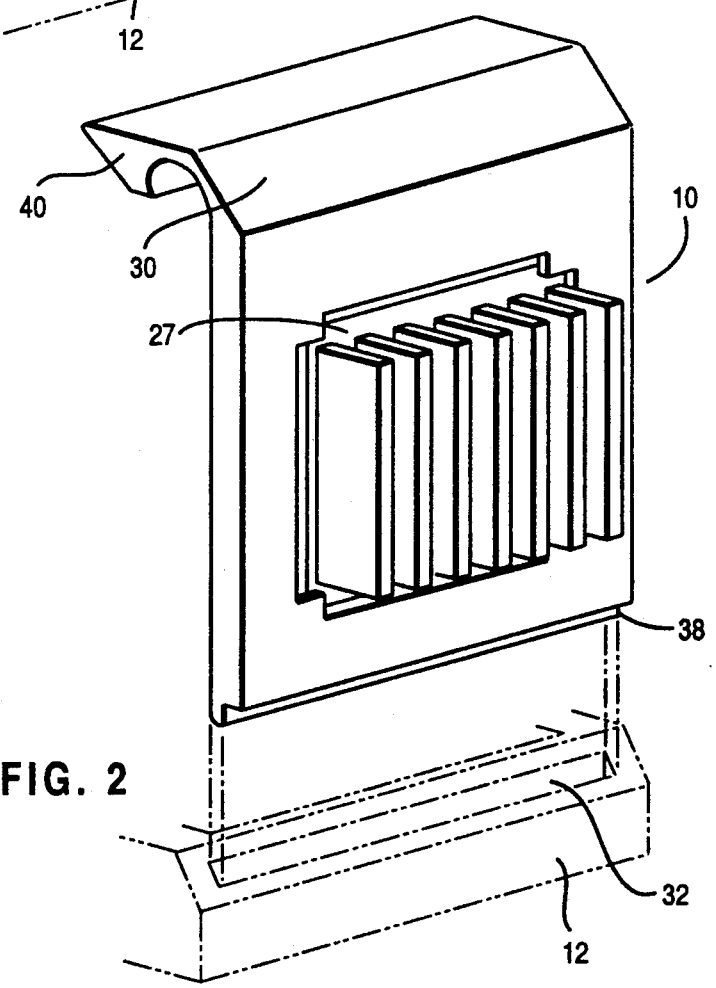
FIG. 2 is a perspective view of an unmounted heat sink assembly.

FIG. 2 shows a vertical heat sink assembly 10 positioned prior to installation into the base 12. This vertical heat sink assembly 10 has a frame 30, the frame 30 having a lip 38 extending along the bottom edge of the frame. Frame 30 further has a catch 40 extending along the top edge of the frame. A base 12 has a slot 32 for accepting lip 38 of the heat sink assembly.

Figure 3:
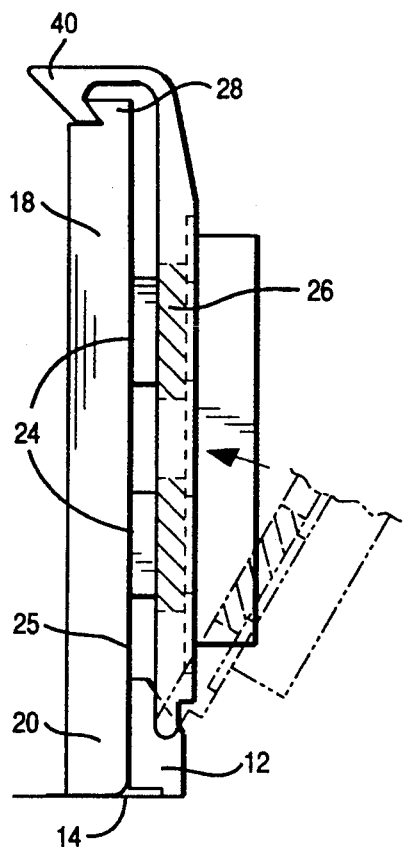
FIG. 3 is a side view of a mounted heat sink assembly.

FIG. 3 shows the vertical heat sink assembly 10 after installation in the base 12. To cool the chips 24, the heat sink assembly 10 is attached adjacent to the carrier assembly 16 as follows. Assembly 10 is inserted in slot 32 of base 12 (as shown in FIG. 2) and is rotated until all chips are in contact with a compliant heat conducting element 26. A catch 40 is then latched onto carrier 18 via clip 28. This heat sink assembly 10 has individual fluid bags or compressible heat conducting media attached at each chip location for cooling.

FIG. 3 further shows the carrier assembly 16 attached to circuit board 14 via buckling beam strips, as disclosed in U.S. Pat. No. 4,943,242, assigned to the same assignee as this patent application, and hereby incorporated by reference. Base 12 rests on top of circuit board 14, and in the preferred embodiment also extends along the edge of the circuit board and is attached thereto by screws or adhesives. It should be understood that other alternative means to attach the base to the circuit board are known in the art, and only the preferred embodiment is here shown. Base 12 holds buckling beam strips at the area in contact with the edge connector 20 of carrier 18, as further described in the above referenced incorporated patent.

Figure 4:
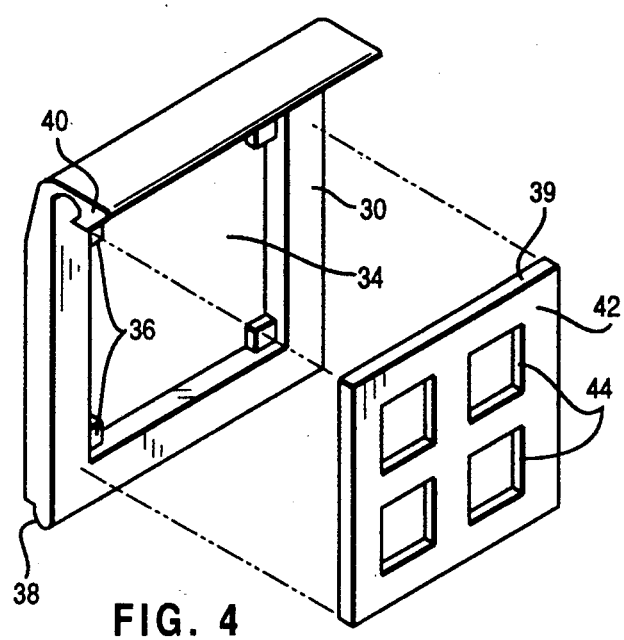
FIG. 4 is an exploded view an unassembled retainer plate assembly.

FIG. 4 shows a detailed view of the unassembled heat sink assembly. Frame 30 surrounds a window 34. In the preferred embodiment, this window is substantially rectangular with the exception of retaining corners 36. The frame 30 has a lip 38 extending laterally along the bottom edge of the frame. The frame further comprises a catch 40 extending laterally along the top portion of frame 30. In an alternate embodiment, this catch might only reside at the two ends, or be spaced along the top portion of the frame 30 in a non-continuous fashion. A retainer plate 42 having retainer windows 44 and outer edges 39 is positioned adjacent to the frame 30 and covers the window 34 such that the corners of the outer edge 39 are positioned substantially adjacent to the retaining corners 36 of the frame 30.

Figure 5:
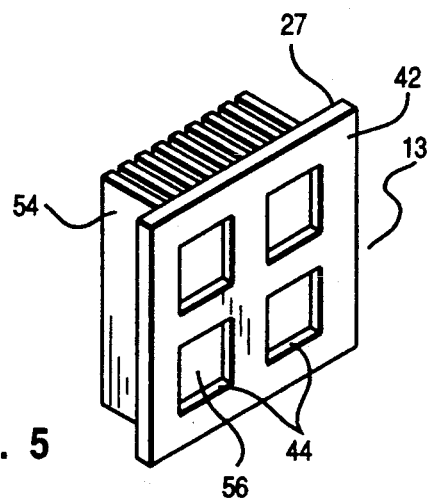
FIG. 5 is one embodiment of an assembled retainer plate assembly.

FIG. 5 shows a particular embodiment of the retainer plate assembly 13 having a heat sink face 56 attached to the back side 27 of the retainer plate 42. This face 56 has a fluid filled compliant element attached thereto, forming a compliant interface to the integrated circuit chips or modules which are to be cooled. This face 56 further comprises heat sink fins 54 radiating away from the retainer plate 42.

Figure 6:
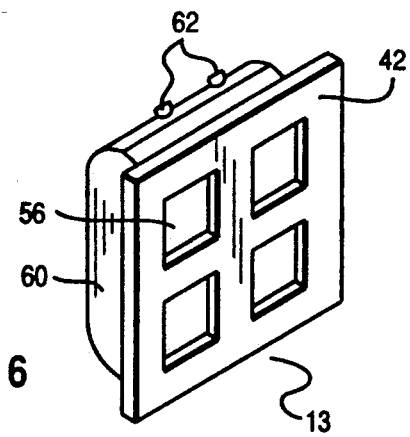
FIG. 6 is another embodiment of an assembled retainer plate assembly.

FIG. 6 shows an alternate embodiment of this retainer plate assembly 13 which also has a heat sink face 56 attached to the back side of the retainer plate 42. However, instead of using heat sink fins to dissipate heat, a heat transfer bag 60 is a part of the heat sink face 56. This transfer bag 60 has ports 62 for the intake and outtake of fluids used in a conventional forced fluid flow cooling process.

In regards to either FIG. 5 or FIG. 6, the retainer plate assembly will have its retainer plate 42 attached to the frame 30 in the manner for attachment as described in FIG. 4. In this attachment, the heat sink fins 54 or heat transfer bag 60 extend through the window 34 of frame 30 in FIG. 4 and protrude out the back side of the frame 30. This protruding heat sink is similarly shown in FIG. 2.

While we have illustrated and described the preferred embodiments of our invention, it is to be understood that we do not limit ourselves to the precise constructions herein disclosed and the right is reserved to all changes and modifications coming within the scope of the invention as defined in the appended claims.

We claim:

1. An apparatus for removing heat from a carrier having a plurality of heat sources attached thereto comprising:
   a frame having means for releasably interconnecting to a carrier, said frame defining a frame window therethrough; and
   heat transfer means disposed within said frame window for transferring heat through said frame window, wherein said heat transfer means further comprises:
      a retainer plate assembly comprising a retainer plate which defines a plurality of retainer windows therethrough; and
      a resilient heat transfer material attached to said retainer plate assembly.

2. An apparatus as described in claim 1 wherein said retainer windows are disposed in horizontal reference with said frame window.

3. An apparatus as descried in claim 1 or 2 wherein said resilient heat transfer material is disposed at least partially within said retainer windows.

4. Ana apparatus as described in claim 1 or 2 wherein said retainer plate assembly includes a plurality of heat sink fins extending away from said retainer plate.

5. An apparatus as described in claim 1, or 2 wherein said resilient heat transfer material is a fluid reservoir means for removing heat by a fluid circulating therethrough.

6. An apparatus as described in claim 4 wherein said fins are carried on an outer surface of said retainer plate assembly and extends through said frame window.

7. An apparatus as described in claim 5 wherein said fluid reservoir means is carried on an outer surface of said retainer plate assembly and extends through said frame window.

8. An apparatus as described in claim 5 wherein said fluid reservoir means includes a plurality of ports for circulating said fluid through said reservoir.

9. A combined chip carrier and heat sink assembly comprising:
   a chip carrier having a plurality of chips attached thereto;
   a frame releasably interconnected to said chip carrier, said frame defining a frame window therethrough; and
   heat transfer means disposed at least partially within said frame window and in contact with said chips for transferring heat from said chips through said frame window, said heat transfer means further comprising
   a retainer plate assembly comprising a retainer plate which defines a plurality of retainer windows therethrough, and
      a resilient heat transfer material attached to said retainer plate assembly.

10. An apparatus as described in claim 9 wherein said retainer windows are each disposed in horizontal reference with a corresponding one of said chips.

11. An apparatus as described in claim 9 wherein said retainer windows retainedly hold said resilient heat transfer material and said chips therewith.

12. An apparatus as described in claim 9 wherein said chip carrier comprises a flexible substrate.

13. A combined chip carrier and heat sink assembly comprising:
   a chip carrier having a plurality of chips attached thereto;
   a housing, coupled to said chip carrier, having first means for locating said chip carrier and second means for locating a pivoting heat sink assembly, said pivoting heat sink assembly further comprising
      a frame releasably interconnected to said chip carrier, said frame defining a frame window therethrough and heat transfer means disposed at least partially within said frame window and in contact with said chips for transferring heat from said chips through said frame window.

14. A combined chip carrier and heat sink assembly of claim 13 wherein said heat transfer means further comprises a retainer plate assembly and a resilient heat transfer material attached to said retainer plate assembly.

15. An apparatus as described in claim 13 wherein said housing further comprises at least one buckle beam connector strip having means for electrical interconnection to said carrier.

* * * * *